US009281671B2

(12) United States Patent
Sathyanarayana et al.

(10) Patent No.: US 9,281,671 B2
(45) Date of Patent: Mar. 8, 2016

(54) CAST ONE-PIECE OUTLET BOX

(71) Applicant: Sigma Electric Manufacturing Corporation, Garner, NC (US)

(72) Inventors: Ashok Alilughatta Sathyanarayana, Pune (IN); Pushpak Paris Yabrer, Pune (IN); Santosh Ganpat Shinde, Pune (IN)

(73) Assignee: SIGMA ELECTRIC MANUFACTURING CORPORATION, Garner, NC (US)

( * ) Notice: Subject to any disclaimer, the term of this patent is extended or adjusted under 35 U.S.C. 154(b) by 0 days.

(21) Appl. No.: 14/516,269

(22) Filed: Oct. 16, 2014

(65) Prior Publication Data

US 2015/0101840 A1    Apr. 16, 2015

Related U.S. Application Data

(60) Provisional application No. 61/891,692, filed on Oct. 16, 2013.

(51) Int. Cl.
*H02G 3/08* (2006.01)
*H05K 5/00* (2006.01)

(52) U.S. Cl.
CPC ............... *H02G 3/08* (2013.01); *H02G 3/081* (2013.01); *H05K 5/00* (2013.01)

(58) Field of Classification Search
CPC ......... H02G 3/08; H02G 3/081; H02G 3/088; H02G 3/10; H02G 3/12; H02G 3/16; H05K 5/00; H05K 5/02; H01R 13/46
USPC ............ 174/480, 481, 50, 53, 57, 58, 152 G, 174/153 G, 62, 500, 503; 220/3.2–3.9, 4.02; 248/906, 343
See application file for complete search history.

(56) References Cited

U.S. PATENT DOCUMENTS

| 4,343,411 | A | * | 8/1982 | Chesnut et al. | 220/3.8 |
|---|---|---|---|---|---|
| 4,770,311 | A | * | 9/1988 | Wang | 220/3.2 |
| 4,880,128 | A | * | 11/1989 | Jorgensen | 220/3.9 |
| 4,892,211 | A | * | 1/1990 | Jorgensen | 220/3.2 |
| 5,836,048 | A | * | 11/1998 | Rossman et al. | 174/153 G |
| 5,857,581 | A | * | 1/1999 | Jorgensen | 220/3.2 |
| 6,242,696 | B1 | * | 6/2001 | Reiker | 174/62 |
| 6,770,811 | B1 | * | 8/2004 | Gretz | 174/50 |
| 6,909,045 | B2 | * | 6/2005 | Halbert | 174/50 |

* cited by examiner

*Primary Examiner* — Angel R Estrada
(74) *Attorney, Agent, or Firm* — Cantor Colburn LLP

(57) ABSTRACT

In an example an integral wiring box comprises: a circular base having a base wire access point; a side wall extended from a perimeter edge of the base forming a cavity having an internal surface and an external surface and a side wall wire access point; a base conduit extending from the base wire access point into the cavity; a side wall conduit extending from the side wall wire access point into the cavity; an internal mounting projection extending from the internal surface of the side wall into the cavity and free from attachment to the circular base, the internal mounting projection further comprising a mounting hole; and an external mounting projection extending from the external surface of the side wall away from the base, the external mounting projection further comprising a mounting hole; wherein a single mounting hub extends from the base into the cavity, wherein the base, side wall, internal mounting projection, external mounting projection, and mounting hub, are formed as a single component.

15 Claims, 4 Drawing Sheets

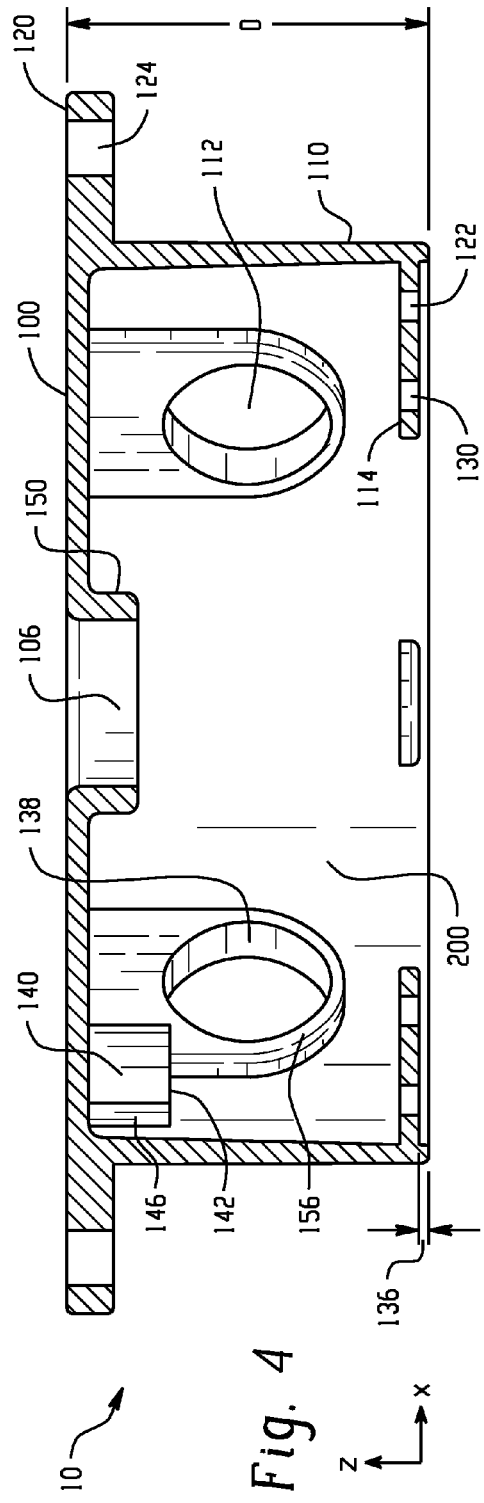
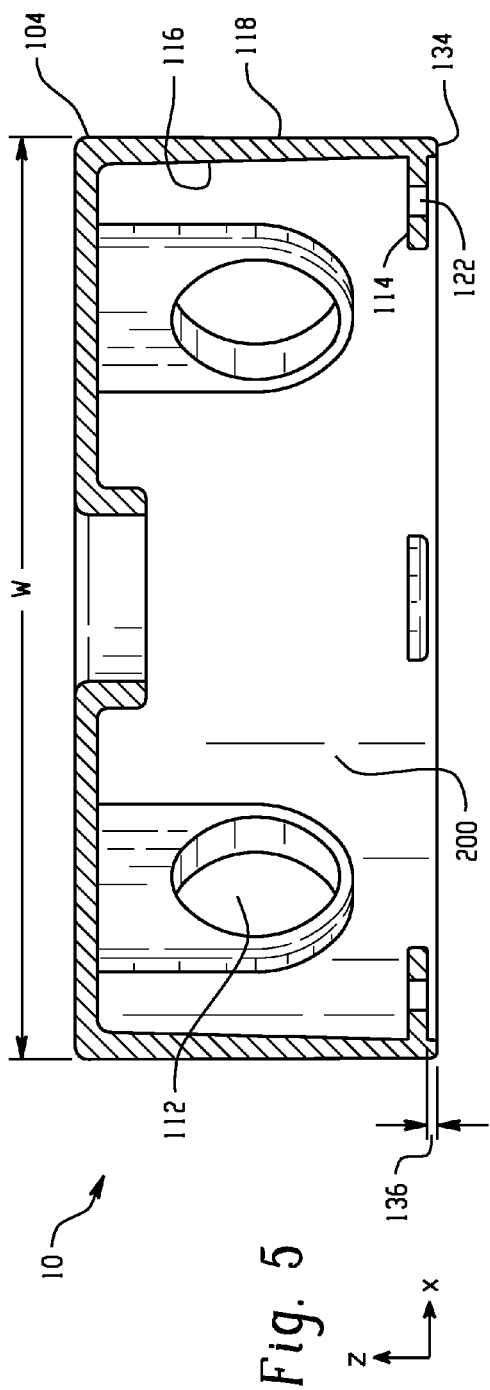

CAST ONE-PIECE OUTLET BOX

CROSS REFERENCE TO RELATED APPLICATIONS

The present application claims priority to U.S. Provisional Application Ser. No. 61/891,692, filed Oct. 16, 2013, the contents of which are incorporated hereby in reference.

BACKGROUND

Wiring boxes for containing electrical connections are known. Wiring entering a wiring box is typically connected to a particular electrical fixture or receptacle such as a lighting fixture, outlet, or switch. Outlet boxes can be used in exposed-conduit wiring installations where they are exteriorly mounted to a wall, column or ceiling and exposed to various environmental conditions. Wiring boxes typically include a housing and two plates removably attached thereto. These boxes are not sealed and allow water and dirt entry. The housing includes ribs formed with the walls of the housing and plates that have openings along the edges for securely fastening the plates to the housing. The design requires many secondary processes to setup and secure the covering plates to the box.

The UL514A test, directed to electrical boxes and the integrity of the plate attachment to the housing, was used to test multiple part boxes that had a steel strip crimped to the box. The test was intended to ensure that the steel strip remained adhered to the box under various conditions. Although industry requirements dictate that the boxes pass, meeting this standard is difficult with boxes assembled from multiple pieces.

Wiring boxes are often the subject of evaluation by organizations that promulgate standards in connection therewith and one of the standards includes that a wiring box should have a minimum resistance to the environmental forces that are typically applied to the wiring box.

In particular, round outlet boxes often have projections extended from the back wall of the housing, for receiving mounting screws to attach electrical fixtures, outlets, or switches to the box. These projections extend from the back wall into a cavity formed by the housing and occupy portions of the working volume of the box, the volume allocated for an electrician to wire the electrical device into the wiring box and ultimately to house the wires connected by the electrician. Some manufacturers offset the working volume lost to the mounting projections by increasing the size of the box (depth and/or diameter), which increases the material cost of the box.

There remains a need for a box that is more resistant to increased environmental forces and maximizes the working volume of the box without increasing the cost of the box.

BRIEF DESCRIPTION

Disclosed herein are wiring boxes, such as integral wiring boxes.

In an example an integral wiring box comprises: a circular base having a base wire access point; a side wall extended from a perimeter edge of the base forming a cavity having an internal surface and an external surface and a side wall wire access point; a base conduit extending from the base wire access point into the cavity; a side wall conduit extending from the side wall wire access point into the cavity; an internal mounting projection extending from the internal surface of the side wall into the cavity and free from attachment to the circular base, the internal mounting projection further comprising a mounting hole; and an external mounting projection extending from the external surface of the side wall away from the base, the external mounting projection further comprising a mounting hole; wherein a single mounting hub extends from the base into the cavity, wherein the base, side wall, internal mounting projection, external mounting projection, and mounting hub, are formed as a single component.

The above described and other features are exemplified by the following figures and detailed description.

BRIEF DESCRIPTION OF THE DRAWINGS

Refer now to the figures, which are exemplary embodiments, and wherein the like elements are numbered alike.

FIG. 4 depicts a cross sectional view of an integral, one-piece, wiring box taken along the centerline of the external mounting projections (FIG. 2 view A-A).

FIG. 5 depicts a cross sectional view of an integral, one-piece, wiring box taken along the centerline of the external mounting projections (FIG. 2 view B-B).

Figure 1:
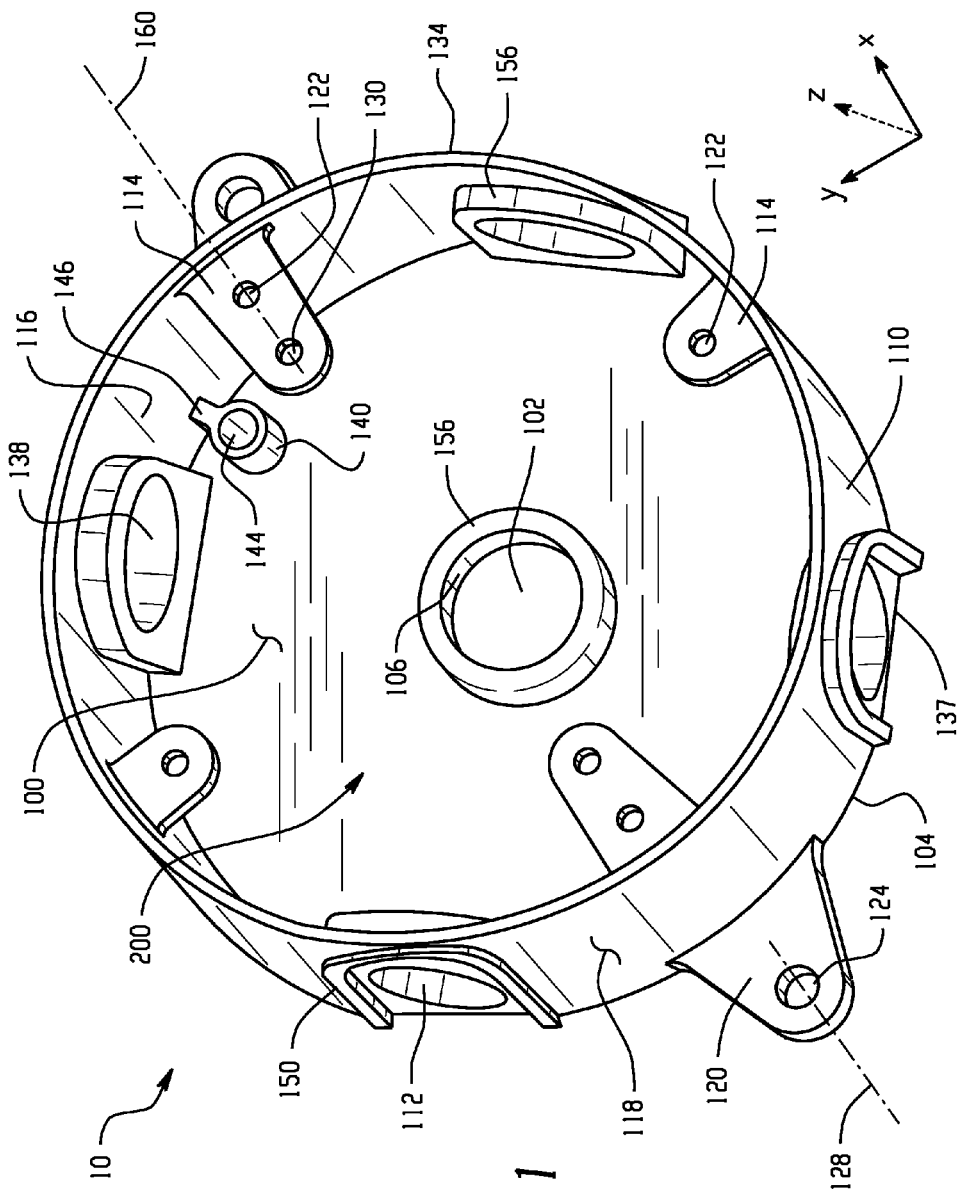
FIG. 1 depicts a tilted front view of an integral, one-piece, wiring box.

The figures are exemplary only and are not drawn to a particular scale. Representative distances may vary.

DETAILED DESCRIPTION

The integral wiring boxes described herein can be of one-piece construction and can offer superior performance in severe weather conditions as well as maximizing available working volume of the box. Integral wiring boxes disclosed herein have enhanced and facile processability including a no-assembly process in addition to improved weatherability and maximal working volume. The integral wiring box can be aluminum or other castable grade metal and can be formed as a single, unitary element. In other words, all features of the box (e.g. mounting projections, mounting protrusion, and wiring openings) can be formed contemporaneously and not formed separately and then attached, drilled, pressed, embossed, tapped, or otherwise affixed to the wiring box after forming. The entire integral wiring box including all the features described herein can be formed as a single component (e.g., cast as a single component; not assembled from multiple parts). The integral box can have a uniform composition (e.g., the entire box is formed from the same metal, metal alloy, or metal composition)

The integral wiring box can comprise a base having a perimeter edge and side wall extended from the perimeter edge to form a wiring cavity with one open side opposite the base. The shape of the base can be substantially circular, accounting for slight deviations from perfectly circular inherent in the manufacture of a mold and/or in casting a part from said mold. A side wall, disposed continuously along the perimeter of the base, can extend from the perimeter edge of the base substantially perpendicular (accounting for accuracy of manufacturing equipment) to the base and terminate at a side wall edge creating a substantially cylindrical cavity. The base and/or side wall can further comprise a wire access point (also called wire holes, wire openings, holes, and openings) therethrough, wherein the wire access point allows one or more wires to pass through the base or side wall and into the cavity. To enhance weatherproofing the wire opening(s) can be a conduit providing access to the interior of the box. The conduit can be formed with housings that extend from the base and/or side wall into the cavity and can provide additional structural integrity (particularly to the side wall). These housings (herein referred to as extension housings) can extend from the side wall and/or base a distance of 0.1 millimeters (mm) to 12.0 mm, for example, 1.0 mm to 8.0 mm, or 2.5 mm to 4.0 mm. The wire opening(s) through the side wall can be located along the side wall in various configurations, positions, and/or orientations according to the wiring box application (i.e. end use). For example, wire opening(s) through the side wall can be tilted to reduce the bending radius of wires that enter the box from a particular direction, where the tilted orientation can be relative to a surface which is perpendicular to the base, such as to create an oval when the opening is projected onto a plane which is perpendicular to the base (i.e. the opening can be non-coplanar with a plane perpendicular to the base).

The side wall can further comprise an internal mounting projection extended from the inside surface of the side wall and substantially parallel to the base (wherein the centerline of the projection is substantially normal to, perpendicular to the tangent plane of, the inside surface at the connection point). The internal mounting projection can comprise a mounting hole therethrough, for attaching an electrical fixture and/or a covering (e.g. aesthetic fascia) to the wiring box. The mounting hole can further comprise female threads for receiving a male thread from a fastening screw. The internal mounting projections can be positioned a distance from the side wall edge as measured in a direction perpendicular the base (z-axis direction in the FIGS), terminal edge opposite the base, so as to provide a gap between the internal mounting projection and the side wall edge. The gap can have a depth from the side wall edge, as measured along the z axis, of 0.1 mm to 3.0 mm, for example, 0.6 mm to 2.0 mm. This gap can allow for flush installation of a box cover where the outside surface of the cover (surface opposite the wiring cavity and mounting projections) can be flush with the side wall edge when attached to the box.

The internal mounting projections are free of attachment to the base, they are attached only to the inside surface of the side wall opposite the base. In so doing, the working volume of box (cavity volume) can be maximized. Attaching the mounting projections to the side wall, and not the base, reduces the material needed in the fabrication of the wiring box and more of the wiring cavity volume is empty. This can reduce the manufacturing cost of the wiring box and improve the ease of working within the wiring cavity (i.e. the act of wiring or electrical device installation). Although the internal mounting projections do not attach to the base they have sufficient structural integrity for the desired end use; capable to endure box installation, box removal, wiring, re-wiring, electrical fixture mounting, electrical fixture removal, and the like without compromise. The internal mounting projections are specifically capable to endure inadvertent strikes from a hammer when the box is being mounted (e.g. nailed) to a support using an external mounting projection.

Internal mounting projections can be circumferentially distributed around the perimeter of the side wall edge, spaced at equal distances around the circle. The internal mounting projections can have a thickness, as measured along the z axis, of 0.5 mm to 3.0 mm, for example, 1.0 mm to 2.5 mm. The internal mounting projections can be used to mount an electrical fixture and/or box cover. The internal mounting projections can extend a distance of 2 mm to 20 mm into the cavity in the radial direction, for example, 6 mm to 20 mm.

The side wall can vary in thickness along the z-axis direction to improve the structural integrity of the box or can have a uniform thickness. The side wall can have a maximum thickness (distance between the internal surface and external surface of the side wall) as measured in the radial direction, from the center of the base, of 1.0 mm to 6.0 mm, for example 2.0 mm thick. The portion of the side wall proximal to the base can be thicker than the side wall at the terminal end of the side wall, opposite the base (side wall edge).

The base can have a thickness as measured along the z-axis direction of 1.0 mm to 6.0 mm, for example, 2.0 mm thick.

The external mounting projections can have a thickness as measured along the z-axis direction of 0.1 mm to 10.0 mm, for example, 2.0 mm to 8.0 mm, or, 4.0 to 6.0 mm, or, 5.0 mm thick. The external mounting projections can extend a distance of 2 mm to 20 mm away from the external surface of the side wall in the radial direction, for example, 4 mm to 20 mm.

Herein electrical fixtures can include a duplex outlet, GFCI outlet, switch, dimmer switch, light fixture, relay, timer, or the like, and any electrical device that can be hardwired into an electrical circuit.

Additionally, an external mounting projection can be extended from the outside surface of the side wall away from the base and can comprise a mounting hole therethrough for attaching the box to a support. The number, location, and/or orientation of the external mounting projections can be dictated by product design standards and/or product end use. For example, the external mounting projections can radially extend from the external surface of the side wall, away from the cavity, from terminal end of the side wall, opposite the base (side wall edge furthest from the base as measured in the z-axis direction); can radially extend from the external surface of the side wall, away from the base at the base perimeter edge (where the base and side wall connect); or, can radially extend from the external surface of the side wall, away from the cavity, at any point along the depth of the box as measured in the z-axis direction.

The external mounting projections can be aligned with the internal mounting projections, where the centerline of the external mounting projection is coplanar with the centerline of the internal mounting projection or can be clocked (rotated, out of phase) relative to the internal mounting projection, where the centerline of the external mounting projection is not coplanar with the centerline of the internal mounting projection.

The side wall can further comprise an integrally formed indentation to add structural integrity, increasing the stiffness of the box and minimizing material used in forming the extension housing. The indentation can be disposed on the outside surface of the side wall, opposite the cavity, and can extend into the base and/or the side wall. Furthermore, lip(s) can extend from the outside surface of the side wall away from the cavity, at least partially surrounding the opening(s) through the side wall, and can serve to provide a longer conduit for wires to pass through, improve the structural integrity of the box, and blunt the edge of the opening(s) through the side wall. Lips can extend from the side wall away from the cavity a distance, as measured in the radial direction, of 0.1 mm to 5 mm, for example, 0.8 mm to 2.0 mm.

Apart from an extension housing(s) the base can have a single projection into the wiring cavity in the form of a mounting hub for attaching a ground wire to the box. In other words, the wiring cavity is free of protrusions from the base, other than a single protrusion for attaching a ground wire. The hub can extend from the base and/or the side wall with any cross sectional shape, e.g. cylindrical, keyhole shaped, oval, or a simple polygon with straight or curved lines. The edges of the hub can be rounded to prevent wire damage (chaffed, cut, or punctured insulation) when electrical wires are installed, moved, removed, or otherwise worked with while inside the wiring box.

All edges of the box can be blunted to reduce the likelihood of wire damage during use. In other words, the edges can be chamfered or rounded to eliminate or reduce the potential to damage wires as they pass across edges of the box. In particular, the terminal edge of the side wall, edges of the internal projection(s), edges of the external projection(s), edges of the face of the ground wire mounting hub, and the edge of the wire opening(s) can be blunted in order to reduce the likelihood of damage to wire insulation when wire is inserted through the openings into the cavity, manipulated once inside the cavity, moved outside of the cavity, removed from the cavity or otherwise worked with while inside the cavity. Blunting can be achieved by thickening the side wall surrounding the opening or edge (i.e. extension housing), providing a lip around the opening, and/or by rounding the edge(s) or opening(s) and can be integral to the casting of the wiring box, formed contemporaneously with the box and all the other features disclosed herein.

FIGS. 1-5 illustrate an integral wiring box 10 having a circular base 100 and side wall 110. The base 100 comprises a single base wire access point 102 (i.e. opening) therethrough, centered in the base. The base wire access point 102 is surrounded by an extension housing 156 extending into the cavity 200, creating a base conduit 106 through which wires can pass into the cavity. The side wall 110 extends from the perimeter edge 104 of the base 100 in the z-axis direction, perpendicular to the base 100, to a wiring box depth D to form a wiring cavity 200. The base 100 is shown in a substantially circular shape and extends a length L in the y-axis direction and width W in the x-axis direction. Since the base is substantially circular L is substantially equal to W. The side wall comprises four side wall wire access points 112 (i.e. openings) centered in the z-axis direction in the side wall 110, and equally spaced circumferentially around the base (90° apart from one another). The side wall wire access points 112 are surrounded by extension housings 156 extending from the base and side walls into the cavity 200, creating conduits 138 through which wires can pass into the cavity. Indentations 137 in the outside surface 118 of the side wall 110 reduce the amount of material used to create the extension housing 156 (and conduits 138).

The side wall 110 further comprises four internal mounting projections 114 extending from the inside surface 116 of the side walls 110 into the cavity 200, parallel to the base 100. The centerline 160 of each internal mounting projection 114 is substantially normal to the internal surface of the side wall, perpendicular to the tangent plane at the point where the centerline intersects the side wall. The internal mounting projections 114 are equally spaced circumferentially around the base (wherein the centerlines of each internal projection are 90° apart from one another). The internal mounting projections 114 are clocked (offset or out of phase) relative to the side wall wire access points 112 by 45° such that each side wall wire access point is equally spaced between adjacent internal mounting projections 114 and vice versa (each internal mounting projection is equally spaced between adjacent wiring openings).

The internal mounting projections 114 are positioned inside the cavity 200 a distance measured in the z-axis direction from the side wall edge 134 to form a gap 136. The gap 136 allows an electrical fixture or box cover to be flush mounted with the side wall edge 134. The internal mounting projections 114 each comprise a mounting hole 122, 130 for mounting an electrical fixture and/or box cover to the integral wiring box 10. Two of the four internal mounting projections 114, opposingly oriented, have two mounting holes 122, 130. The inner mounting hole 130 (closer to the center of the cavity) can be used for mounting an electrical receptacle, electrical switch, or electrical device which is generally then covered with a plate (switch plate, receptacle plate, or the like) while the outer mounting hole 122 (closer to the side wall edge 134) can be used for mounting a box cover, receptacle plate, switch plate, and the like. The side wall 110 further comprises external mounting projections 120 extending outwardly from the outside surface 118 of the side wall 110 away from the base.

The side wall still further comprises two external mounting projections 120. The external mounting projections 120 further comprise mounting holes 124 for securely mounting the box to a support, e.g. wall, joist, stud, board, sheathing, brick, stucco, siding, concrete, cinderblock, wood, metal, stone, and the like (not shown). Wires can then be introduced into the box via wire access points 102, 112 (e.g. through conduits 106, 138). Disposed around wires penetrating the cavity 200, through the base and/or side wall wire access points 102, 112, and/or disposed around the base and/or side wall wire access points 102, 112 can be a gasket(s), grommet(s), and other waterproof sealants (e.g., silicone) or a combination comprising at least one of the foregoing to inhibit the passage of moisture, debris, insects, and the like, into the wiring cavity 200. Additionally, disposed between a cover (not shown) and the cavity can be a sealing element to inhibit the passage of moisture, debris, insects, and the like, into the wiring cavity 200 from the front side of the box (side opposite the base 100). The sealing element can be in the form of a gasket, grommet, waterproof sealant, or a combination comprising at least one of the foregoing, and can be disposed between the cover and the cavity 200. In particular, the sealing element can be disposed on the side wall edge 134, in the gap 136, on the internal mounting projections 114, along the perimeter edge of the cover, around the inside surface 116 of the side wall 110 adjacent the side wall edge 134, or a combination comprising at least one of the foregoing.

Figure 2:
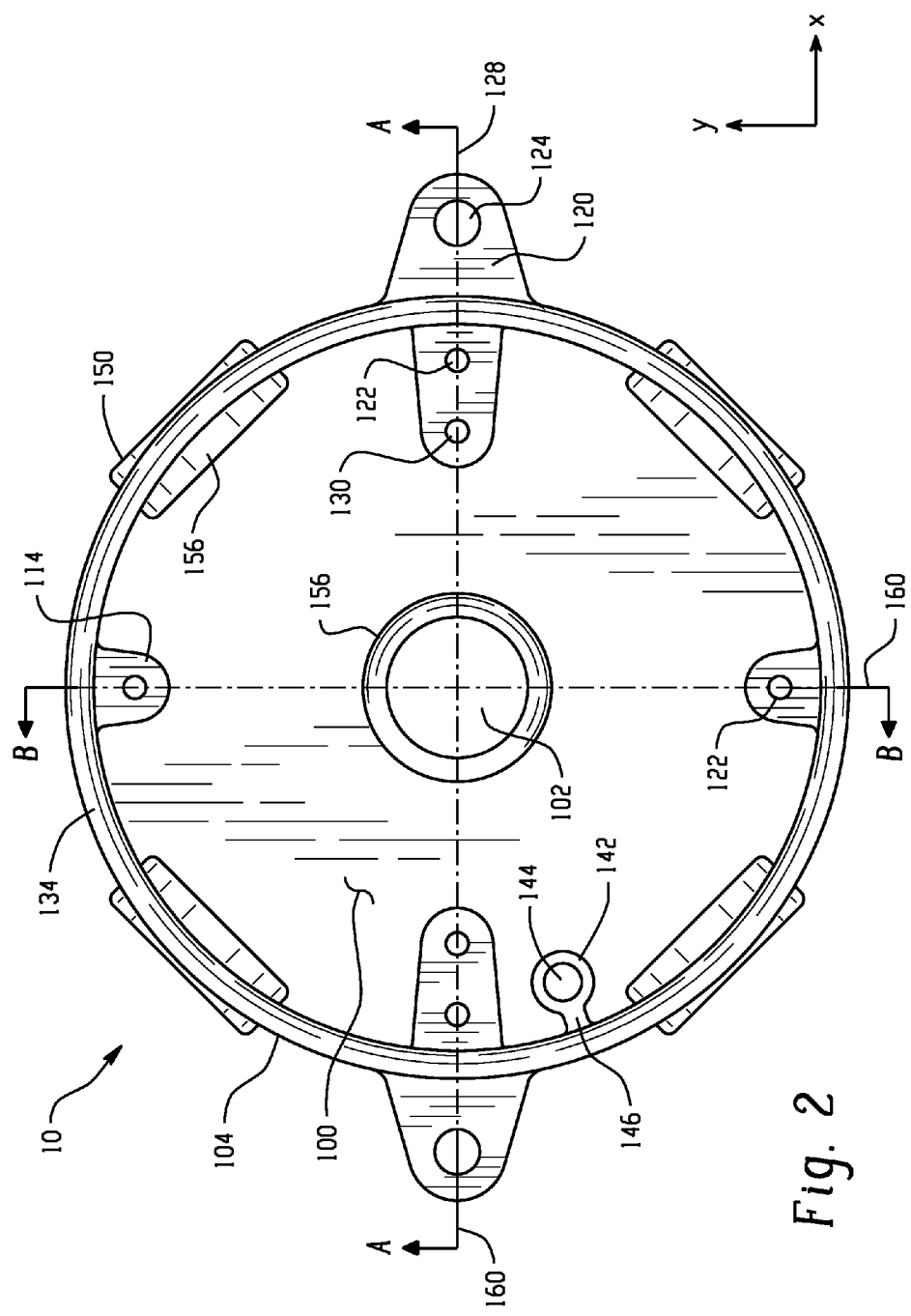
FIG. 2 depicts a top view of an integral, one-piece, wiring box.
Figure 3:
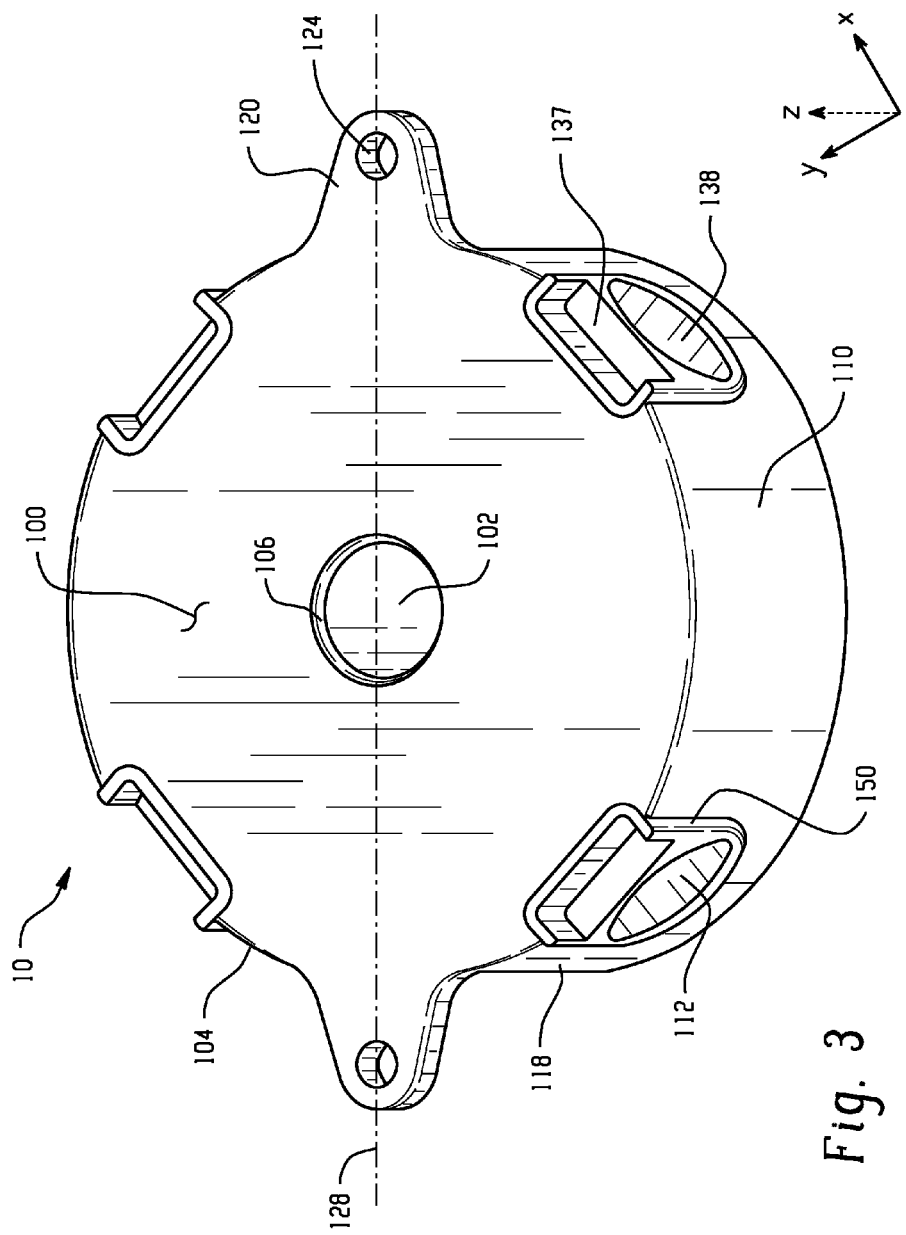
FIG. 3 depicts a tilted back view of an integral, one-piece, wiring box.

The centerlines 128 of the two external mounting projections 120 are coplanar with two of the internal mounting projections 114 (the internal mounting projections having two mounting holes 122,130) as can be seen in FIG. 2. By aligning in this way the box can be attached to a support (e.g. a wall stud), via the mounting holes 124, with the centerlines of the external mounting projections extending in the vertical direction (parallel to the direction in which gravity acts) such that an electrical fixture (e.g. duplex outlet) when installed is also oriented in the vertical direction.

The base 100 further comprises a single ground wire mounting hub 140 extending from the base 100 and inside surface 116 of the side wall 110 into the cavity 200. The hub 140 is shown with a keyhole shape, i.e. cylindrical with a single radial extension 146 connecting the cylinder to the side wall 110. The top face 142 of hub 140 comprises rounded edges, and further comprises a mounting hole 144 for mounting a ground wire (not shown). The mounting holes 122, 130, and 144 comprise female threads for receiving male threads of a fastening screw to simplify installation of electrical fixtures, wires, and a box cover. The box mounting hole 124 is not threaded to facilitate the use of nails, screws, bolts or other fastener when attaching the box to a support.

The wiring box can be a unitary element, requiring no post-assembly process or procedure and reducing the number of components required to form a wiring box. Accordingly, less material is required to form the box and less labor is needed, as there is no post-assembly requirement. Hence, this unitary electrical junction box reduces material and labor costs while never failing, or even needing, to test UL514B since there are no plates attached to the box which would require testing.

Set forth below are examples of integral wiring boxes described herein.

Embodiment 1

An integral wiring box comprising: a circular base having a base wire access point; a side wall extended from a perimeter edge of the base forming a cavity having an internal surface and an external surface and a side wall wire access point; a base conduit extending from the base wire access point into the cavity; a side wall conduit extending from the side wall wire access point into the cavity; an internal mounting projection extending from the internal surface of the side wall into the cavity and free from attachment to the circular base, the internal mounting projection further comprising a mounting hole; and an external mounting projection extending from the external surface of the side wall away from the base, the external mounting projection further comprising a mounting hole; wherein a single mounting hub extends from the base into the cavity, wherein the base, side wall, internal mounting projection, external mounting projection, and mounting hub, are formed as a single component.

Embodiment 2

The integral box of Embodiment 1, wherein the box comprises aluminum, castable grade metal, or a combination comprising at least one the foregoing.

Embodiment 3

The integral box of any of Embodiments 1-2, wherein the box further comprises: a cover, covering the cavity; and a sealing element disposed between the cover and the cavity, wherein the sealing element comprises a gasket, grommet, waterproof sealant, or a combination comprising at least one of the foregoing.

Embodiment 4

The integral box of any of Embodiments 1-3, wherein the box further comprises a gasket, grommet, waterproof sealant, or a combination comprising at least one of the foregoing disposed around wires penetrating the cavity.

Embodiment 5

The integral box of any of Embodiments 1-4, further comprising four internal mounting projections.

Embodiment 6

The integral box of Embodiment 5, wherein two internal mounting projections are positioned on the side wall opposite one another, each of the two internal mounting projections comprising two mounting holes therethrough.

Embodiment 7

The integral box of any of Embodiments 5-6, wherein two internal mounting projections are positioned on the side wall opposite one another, each of the two internal mounting projections comprising one mounting hole therethrough.

Embodiment 8

The integral box of any of Embodiments 1-7, wherein the internal mounting projection is offset a distance as measured on a z-axis from the side wall edge to form a gap.

Embodiment 9

The integral box of any of Embodiments 1-8, wherein the single mounting hub further comprises a mounting hole.

Embodiment 10

The integral box of Embodiment 9, wherein the mounting hole further comprises female threads.

Embodiment 11

The integral box of any of Embodiments 1-10, wherein the single mounting hub has a keyhole shape Embodiment 12

The integral box of any of Embodiments 1-11, wherein the mounting holes of the internal mounting projections further comprise female threads.

Embodiment 13

The integral box of any of Embodiments 1-12, wherein the base, side wall, or a combination comprising at least one of the foregoing further comprises indentations.

In general, the invention may alternately comprise, consist of, or consist essentially of, any appropriate components herein disclosed. The invention may additionally, or alternatively, be formulated so as to be devoid, or substantially free, of any components, materials, ingredients, adjuvants or species used in the prior art compositions or that are otherwise not necessary to the achievement of the function and/or objectives of the present invention.

All ranges disclosed herein are inclusive of the endpoints, and the endpoints are independently combinable with each other (e.g., ranges of "up to 25 wt. %, or, more specifically, 5 wt. % to 20 wt. %", is inclusive of the endpoints and all intermediate values of the ranges of "5 wt. % to 25 wt. %," etc.). "Combination" is inclusive of blends, mixtures, alloys, reaction products, and the like. Furthermore, the terms "first," "second," and the like, herein do not denote any order, quantity, or importance, but rather are used to denote one element from another. The terms "a" and "an" and "the" herein do not denote a limitation of quantity, and are to be construed to cover both the singular and the plural, unless otherwise indicated herein or clearly contradicted by context. The suffix "(s)" as used herein is intended to include both the singular and the plural of the term that it modifies, thereby including one or more of that term (e.g., the film(s) includes one or more films). Reference throughout the specification to "one embodiment", "another embodiment", "an embodiment", and so forth, means that a particular element (e.g., feature, structure, and/or characteristic) described in connection with the embodiment is included in at least one embodiment described herein, and may or may not be present in other embodiments. In addition, it is to be understood that the described elements may be combined in any suitable manner in the various embodiments.

While particular embodiments have been described, alternatives, modifications, variations, improvements, and substantial equivalents that are or may be presently unforeseen may arise to applicants or others skilled in the art. Accordingly, the appended claims as filed and as they may be amended are intended to embrace all such alternatives, modifications variations, improvements, and substantial equivalents.

We claim:

1. An integral wiring box comprising:
   a circular base having a base wire access point;
   a side wall extended from a perimeter edge of the base forming a cavity having an internal surface and an external surface and a side wall wire access point;
   a base conduit extending from the base wire access point into the cavity;
   a side wall conduit extending from the side wall wire access point into the cavity;
   an internal mounting projection extending from the internal surface of the side wall into the cavity and free from attachment to the circular base, the internal mounting projection further comprising a mounting hole; and
   an external mounting projection extending from the external surface of the side wall away from the base, the external mounting projection further comprising a mounting hole;
   wherein a single mounting hub extends from the base into the cavity, wherein the base, side wall, internal mounting projection, external mounting projection, and mounting hub, are formed as a single component.

2. The integral box of claim 1, wherein the box comprises aluminum, castable grade metal, or a combination comprising at least one the foregoing.

3. The integral box of claim 1, wherein the box further comprises:
   a cover, covering the cavity; and
   a sealing element disposed between the cover and the cavity, wherein the sealing element comprises a gasket, grommet, waterproof sealant, or a combination comprising at least one of the foregoing.

4. The integral box of claim 1, wherein the box further comprises a gasket, grommet, waterproof sealant, or a combination comprising at least one of the foregoing disposed around wires penetrating the cavity.

5. The integral box of claim 1, further comprising four internal mounting projections.

6. The integral box of claim 5, wherein two internal mounting projections are positioned on the side wall opposite one another, each of the two internal mounting projections comprising two mounting holes therethrough.

7. The integral box of claim 5, wherein two internal mounting projections are positioned on the side wall opposite one another, each of the two internal mounting projections comprising one mounting hole therethrough.

8. The integral box of claim 1, wherein the internal mounting projection is offset a distance as measured on a z-axis from the side wall edge to form a gap.

9. The integral box of claim 1, wherein the single mounting hub further comprises a mounting hole.

10. The integral box of claim 9, wherein the mounting hole further comprises female threads.

11. The integral box of claim 1, wherein the single mounting hub has a keyhole shape.

12. The integral box of claim 1, wherein the mounting holes of the internal mounting projections further comprise female threads.

13. The integral box of claim 1, wherein the base, side wall, or a combination comprising at least one of the foregoing further comprises indentations.

14. The integral box of claim 9, wherein the mounting hole only extends to the base.

15. The integral box of claim 1, wherein the mounting hub comprises a radial extension connecting the mounting hub to the side wall.

* * * * *